United States Patent [19]

Subrahmanyam et al.

[11] Patent Number: 6,079,426

[45] Date of Patent: *Jun. 27, 2000

[54] METHOD AND APPARATUS FOR DETERMINING THE ENDPOINT IN A PLASMA CLEANING PROCESS

[75] Inventors: Sudhakar Subrahmanyam, Sunnyvale; Tsutomu Tanaka, Santa Clara; Mukul Kelkar, San Jose, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/887,165

[22] Filed: Jul. 2, 1997

[51] Int. Cl.[7] .............................. B08B 6/00; G01L 21/30
[52] U.S. Cl. ........................ 134/1.1; 156/345; 216/59; 216/61; 216/79
[58] Field of Search .............................. 134/1.1; 216/59, 216/61, 79; 156/345

[56] References Cited

U.S. PATENT DOCUMENTS

| | | | |
|---|---|---|---|
| 5,211,825 | 5/1993 | Saito et al. | 156/345 |
| 5,252,178 | 10/1993 | Moslehi | 156/643 |
| 5,413,670 | 5/1995 | Langam et al. | 134/1.1 |

FOREIGN PATENT DOCUMENTS

| | | |
|---|---|---|
| 63-129629 | 6/1988 | Japan . |
| 6-224163 | 8/1994 | Japan . |
| 9-082645 | 3/1997 | Japan . |
| 9-143742 | 6/1997 | Japan . |

OTHER PUBLICATIONS

"Hydrogen Plasma Cleaning of the Si(100) Surface: Removal of Oxygen and Carbon and The Etching of Si"; Kinosky et al.
Abstract Only, Surface Chemical Cleaning and Passivation for Semiconductor Processing Symposium, (Higashi et al.—Editors), 1993.

*Primary Examiner*—William Powell
*Assistant Examiner*—George Goudreau
*Attorney, Agent, or Firm*—Townsend & Townsend & Crew

[57] ABSTRACT

Apparatus and methods are disclosed for utilizing a plasma cleaning operation of a CVD system incorporating cleaning process endpoint detection. In one embodiment, the cleaning process is performed at a constant exhaust capacity and the endpoint detection is in response to a specified rate of change of chamber pressure. In another embodiment, a servo-controlled exhaust system maintains a controlled chamber pressure and the endpoint detection is in response to a specified control signal. In a preferred embodiment, nitrogen trifluoride is converted into a plasma containing free fluorine radicals in a magnetron-powered remote microwave plasma generator. The remotely produced free fluorine radicals are used to remove silicon nitride deposits from a substrate processing chamber. The use of such a remote plasma system provides an efficient cleaning process that takes as little as half the time compared to similar in situ plasma cleaning processes. The incorporation of endpoint detection provides optimal cleaning time for the remote plasma cleaning process.

29 Claims, 8 Drawing Sheets

METHOD AND APPARATUS FOR DETERMINING THE ENDPOINT IN A PLASMA CLEANING PROCESS

BACKGROUND OF THE INVENTION

The present invention relates generally to a method and apparatus for efficiently cleaning a substrate processing chamber of residue, and more particularly to determining the endpoint of a plasma cleaning process.

One of the primary steps in the fabrication of modern semiconductor to devices is the formation of a layer, such as an oxide or nitride layer, on a substrate or wafer. As is well known, such layers can be deposited by chemical vapor deposition (CVD). In thermal CVD processes, reactant gases are supplied to the substrate surface where heat-induced chemical reactions take place to produce a desired film. In typical plasma-enhanced CVD (PECVD) processes, reactant gases are activated in a glow discharge plasma by the application of energy, such as radio frequency (RF) energy, to a reaction zone proximate to the substrate surface. This type of plasma is commonly called an in situ plasma.

During CVD processing, reactant gases are released inside the processing chamber to form layers, such as silicon oxides or nitrides, on the surface of the substrate being processed. However, during such deposition processes, deposition of undesired oxide or nitride residue can occur elsewhere in the CVD apparatus, such as on the walls and passageways of the processing chamber and on chamber components. Over time, failure to clean the residue from the CVD apparatus may result in degraded, unreliable processes and defective wafers.

Typically, two types of cleaning procedures have been used. "Dry cleaning" processes may be performed between deposition processing steps without opening the chamber. A dry clean may be performed after each wafer has been processed, or after n wafers have been processed. "Wet cleans" typically involve opening the processing chamber and physically wiping down the reactor, including the chamber walls, exhaust ports and other areas having residue, with a special cloth and cleaning fluids, and are normally done less frequently than dry cleans. Without these cleaning procedures, impurities from the residue built up in the CVD apparatus can migrate onto the wafer, or particles may fall onto the wafer.

In some instances, an in situ plasma may be used in a dry cleaning process. For example, PECVD systems typically include plasma systems that allow an in situ plasma clean. However, in situ plasma systems may be optimized for layer deposition, and not chamber cleaning. The efficiency of an in situ plasma cleaning process may also depend on plasma density and distribution, and may not adequately clean portions of the chamber not exposed to the in situ glow discharge. Therefore, an in situ plasma cleaning process may not be optimal to clean some substrate processing systems. However, other plasma cleaning processes may be attractive.

Remote plasma generating systems have been shown to be useful in cleaning substrate processing chambers. Remote plasma generating systems generate a plasma outside of the reaction zone in the processing chamber, and then flow plasma species into the chamber. The plasma species react inside the chamber, to remove unwanted residue, for example. Remote plasma generating systems can be added to substrate processing systems, with or without in situ plasma capability, in a variety of configurations.

Some remote plasma generating systems use a waveguide to convey microwave energy from a microwave source to an applicator tube where a plasma precursor gas is converted into a plasma. This plasma is conveyed down the applicator tube to the processing chamber where a chemical reaction between the plasma species and the residue occurs. Even though some recombination of plasma species occurs between the time the precursor gas is irradiated with microwave energy to form a plasma and the time the plasma interacts with the residue, using microwave energy to generate the plasma is quite efficient and often results in higher cleaning (etch) rates than an in situ plasma clean.

It is desirable to know when a dry clean process is complete for at least two reasons. First, it is desirable to maximize wafer throughput and not spend more time than necessary cleaning the chamber. Second, the cleaning process may etch chamber components after removing the residue, which may reduce the operating lifetime of these components. Optical endpoint detection methods have been used to determine the endpoint of in situ plasma clean processes. An optical endpoint detection system may use a photo detector and optical spectrometer to measure the wavelength of the light emitted by the in situ glow discharge. The glow discharge may emit light of one wavelength while etching the residue, and emit a different wavelength of light after the residue has been cleaned. The cleaning process endpoint may be detected when a predetermined change of wavelength has occurred.

This type of optical endpoint detection is not practical for remote plasma cleaning systems because there is no in situ glow discharge, thus one cannot measure its wavelength. Simply timing the remote plasma cleaning process to determine its endpoint may not be suitable because the time necessary to perform a remote plasma clean may vary with the number of layers, composition of layers, total layer thickness, changes in the exhaust or purge gas flow, and other factors. A change in any one factor may change the time needed to clean the chamber and require a recalibration of the cleaning process time. Therefore, simply timing the length of a remote plasma cleaning process to determine its endpoint may not sufficient to determine the endpoint of the cleaning process.

From the above, it can be seen that it is desirable to have an efficient and thorough remote plasma cleaning process. It is also desirable to provide an endpoint detection method and apparatus to enhance utilization of the substrate processing equipment and to reduce the overetching of chamber components. The endpoint detection method should provide a reliable indication of the end of the cleaning process under a variety of cleaning conditions.

SUMMARY OF THE INVENTION

The present invention provides an apparatus and methods for efficiently cleaning a substrate-processing chamber of residues by detecting the end point of the cleaning process. The chamber is exposed to a plasma formed from a cleaning gas and the chamber pressure is measured to determine the rate of change of pressure in the chamber. The plasma is extinguished upon detection of specified rate of change of pressure. In a preferred embodiment, the cleaning gas, such as $NF_3$, contains a halogen, such as fluorine, and the resulting plasma is used to cleans silicon nitride deposits from the chamber. The plasma is formed in a remote plasma generator and flowed into the chamber through a gas distribution faceplate. In one embodiment, the chamber exhaust rate is maintained at a constant rate and the chamber pressure is measured with a pressure sensor to determine the rate of change of the chamber pressure. In another embodiment, the chamber exhaust rate is adjusted to maintain a controlled chamber pressure and a control signal is monitored to determine the rate of change of the chamber. In specific embodiments, the specified rate of change of chamber pressure which produces the endpoint detection signal is a zero rate of change of pressure indicated by a constant chamber pressure or a control signal that indicates a constant chamber pressure.

These and other embodiments of the present invention, as well as its advantages and features, are described in more detail in conjunction with the text below and attached figures.

DESCRIPTION OF THE PREFERRED EMBODIMENT

I. An Exemplary CVD System

Figure 1A:
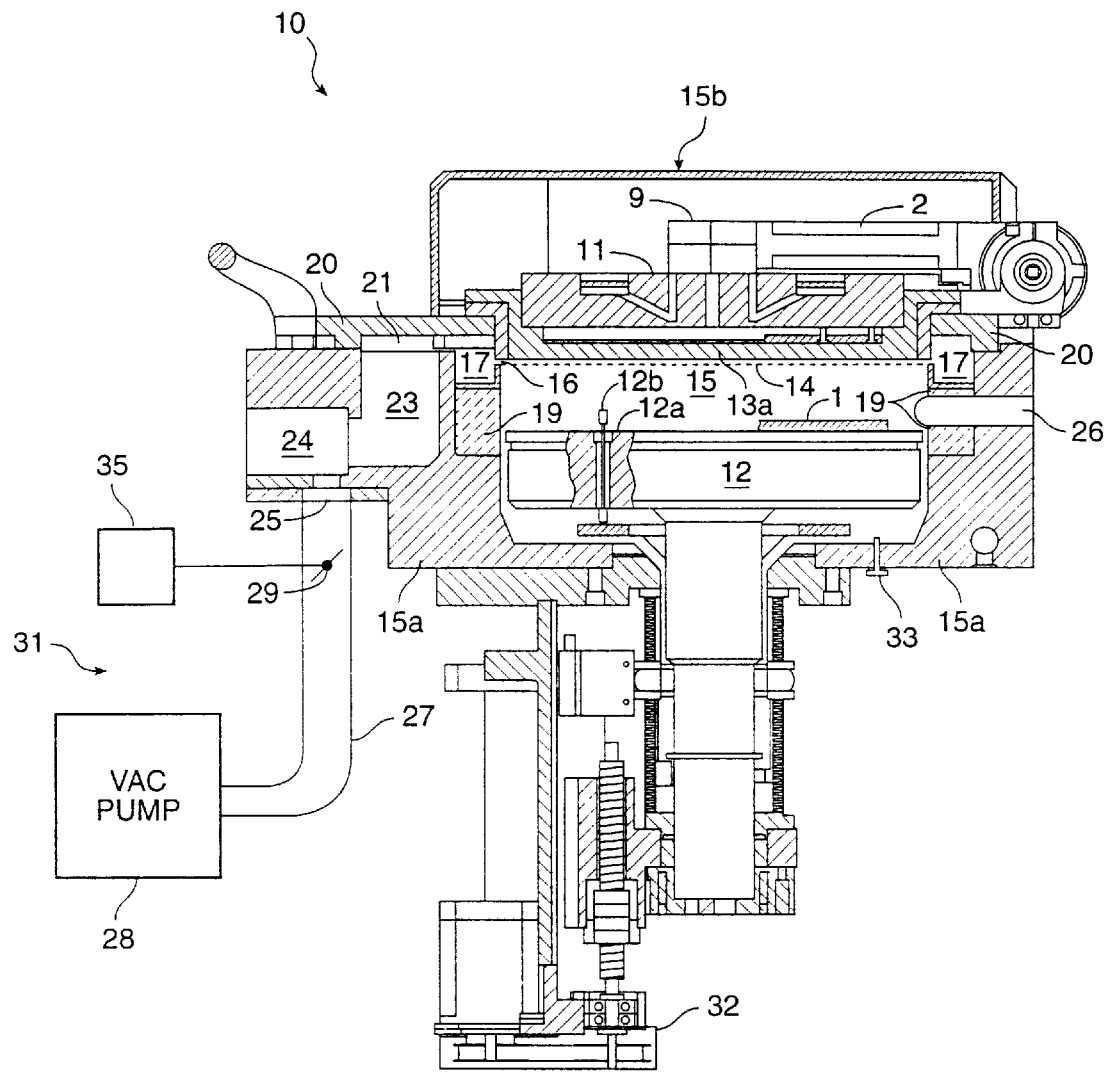
FIGS. 1(a) and 1(b) are vertical, cross-sectional views of one embodiment of a chemical vapor deposition apparatus according to the present invention.
Figure 1B:
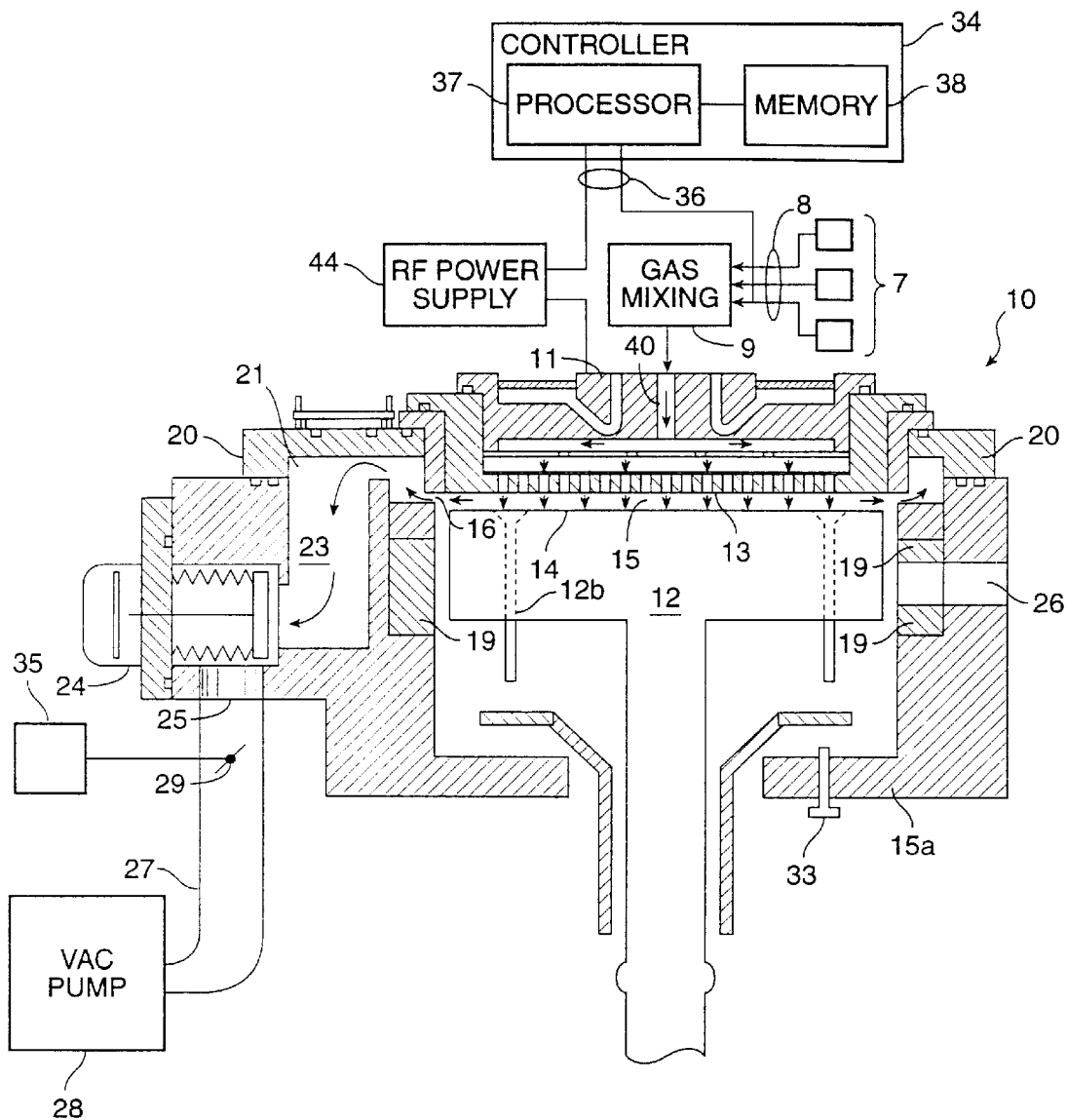
Figure 1C:
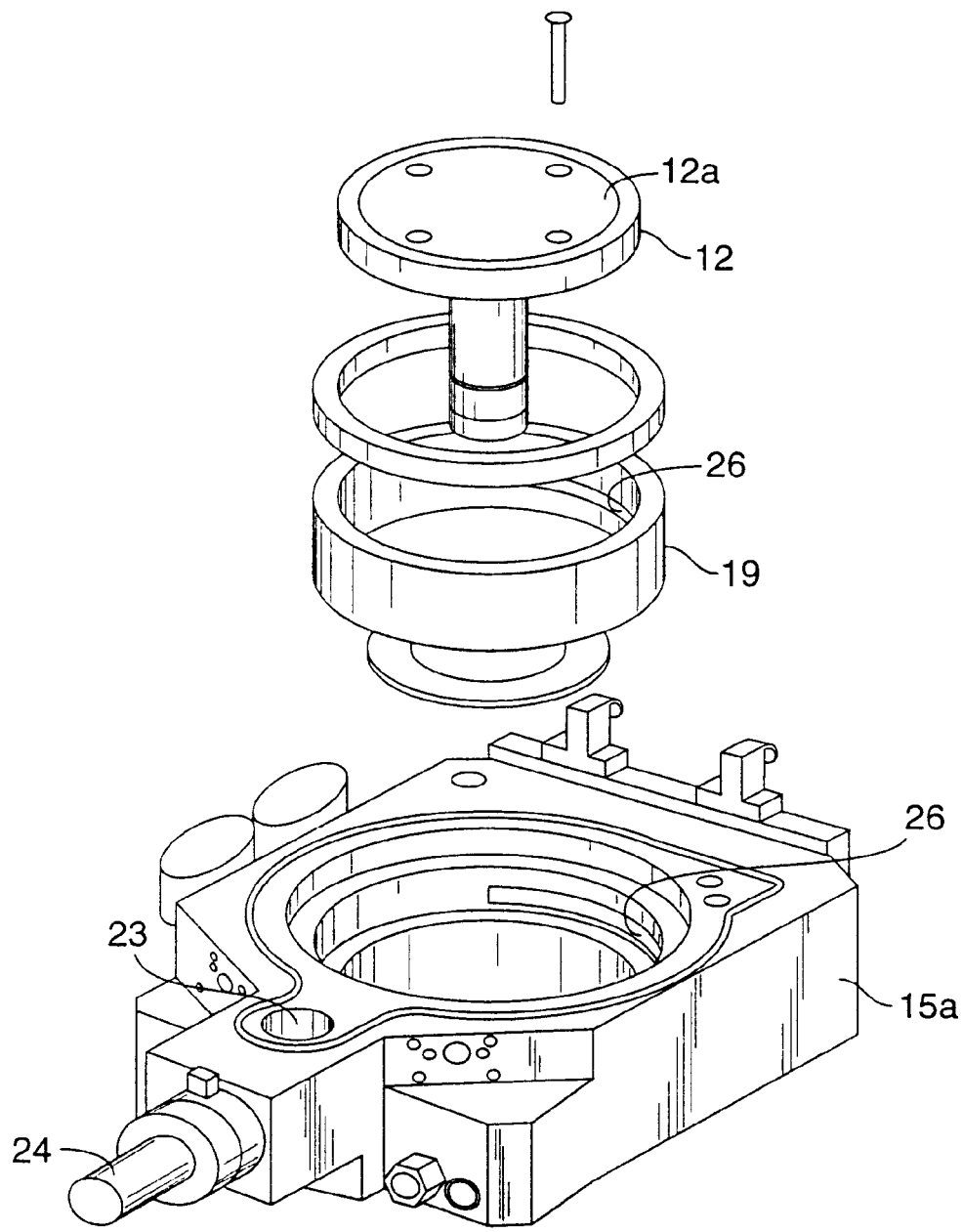
FIGS. 1(c) and 1(d) are exploded perspective views of parts of the CVD chamber depicted in FIG. 1(a)

Specific embodiments of the present invention may be used with, or retrofitted onto, a variety of chemical vapor deposition (CVD) processing machines. One suitable CVD apparatus with which the present invention can be used or to which the invention can be retrofitted is shown in FIGS. 1(a) and 1(b), which are vertical, cross-sectional views of a CVD system 10, having a processing chamber 15 that includes a chamber body 15a and chamber lid assembly 15b. Chamber body 15a and chamber lid assembly 15b, along with other chamber components, are shown in exploded, perspective views in FIGS. 1(c) and 1(d), respectively.

CVD system 10 contains a gas distribution manifold 11 for dispersing process gases above a substrate 1 (only a portion of which is shown) that rests on a heater pedestal 12 centered within the processing chamber 15. During processing, the substrate 1 (e.g., a semiconductor wafer) is positioned on a flat (or slightly convex) upper surface 12a of heater pedestal 12. Heater pedestal 12 can be moved controllably between a lower loading/off-loading position (depicted in FIG. 1(a)) and an upper processing position (indicated by dashed line 14 in FIG. 1(a) and shown in FIG. 1(b)), which is closely adjacent to gas distribution manifold 11. A centerboard (not shown) includes sensors for providing information on the position of the wafers, which may be monitored by a system controller 34.

FIG. 1(b) shows the system controller 34 configured to monitor and control various aspects of the deposition system 10, such as the wafer position, the gas flows, RF or microwave power, and the chamber pressure. The system controller 34 receives information from various sensors, such as from a pressure sensor 33, through sensor lines, such as sensor line 39. The system controller 34 may also receive information from other sensors, such as optical sensors (not shown) and thermocouples (not shown), through other sensor lines (not shown). The system controller 34 may use the information received from sensors to monitor the chamber conditions, or the system controller 34 may use the information for process control.

When using sensor information for process control, the processor 37 compares the information received from the sensor against values stored in the system controller memory 38 according to a processing program stored in the memory 38. The processor 37 generates control signals, if necessary, to adjust the appropriate chamber components. The chamber components receive the control signals through the control lines 36 (only some of which are shown). For example, a processing program may call for a specific chamber pressure to be set and maintained. The processor 37 would read the pressure sensor 33 to determine the chamber pressure and adjust the throttle valve 29, if necessary. Adjusting the throttle valve 29 controls the exhaust rate from the chamber when the vacuum pump 28 is pumping at a constant rate and gas is flowing into the chamber at a constant rate. The throttle valve 29 is controlled with a servo motor 35 that receives a control signal from the system controller 34 through control line 36a. The servo motor may be a stepper motor, for example.

The system controller 34 may also control process parameters without sensor information. For example, the process program stored in memory 38 may call for an event to occur after a specific time, the time being kept by a clock (not shown) incorporated into the system controller 34 or communicating with the system controller 34. Turning a gas flow off after a programmed time limit is just one example of such a control process.

Figure 1D:
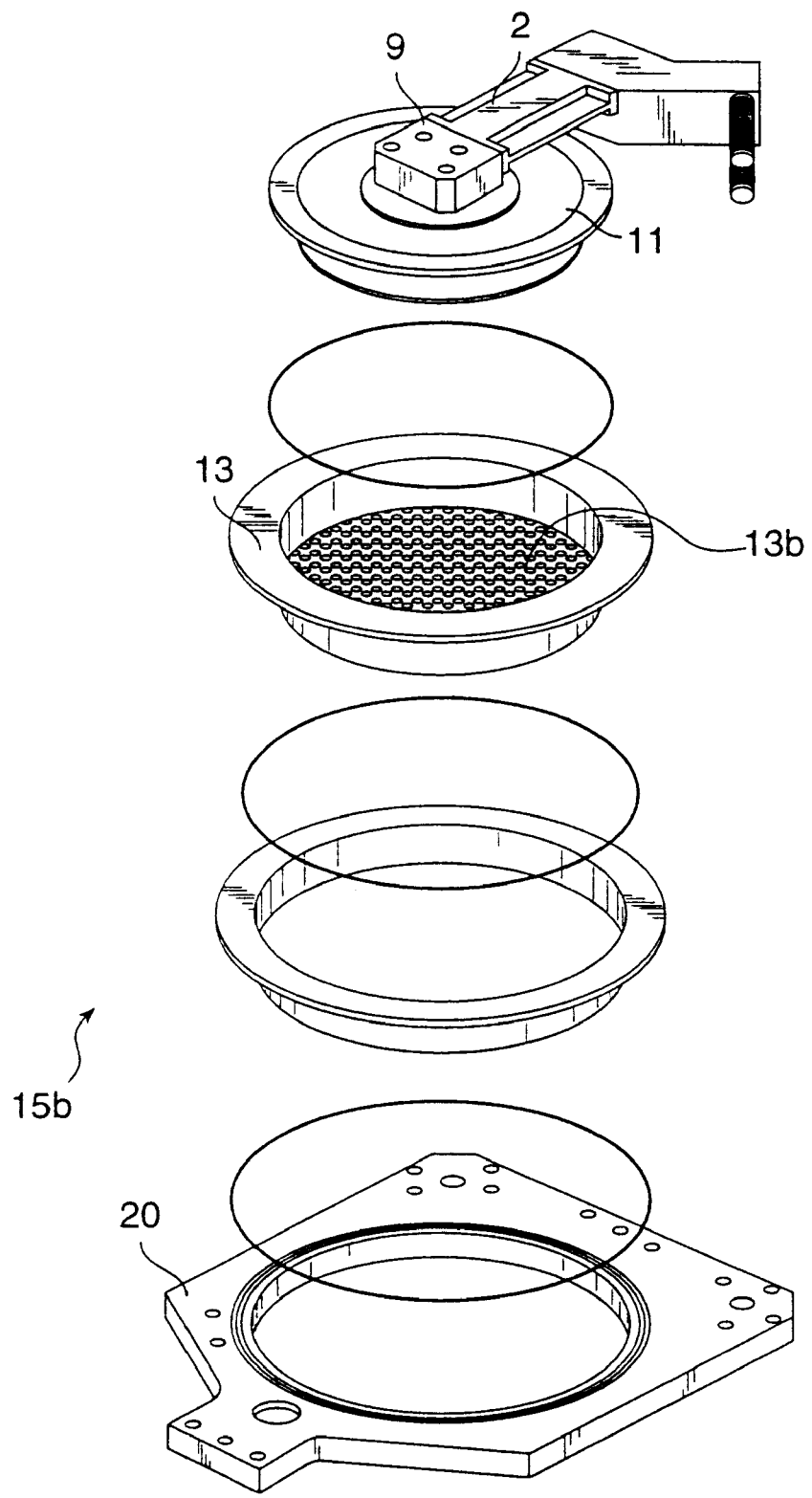

Gases are flown into the processing chamber 15 through perforated holes 13b (FIG. 1(d)) of a gas distribution faceplate 13a. More specifically, deposition process gases flow (indicated by arrow 40 in FIG. 1(b)) into the chamber through the inlet gas distribution manifold 11, through a perforated blocker plate 42 (FIG. 1(b)) and then through perforated holes 13b in gas distribution faceplate 13a.

Before reaching the manifold, deposition and carrier gases are input from gas sources 7 through gas supply lines 8 (FIG. 1(b)) to gas manifold arm 2 and into a gas mixing block 9 where they are combined and then sent to gas distribution manifold 11. Typically, mass flow controllers (not shown) measure the flow of gas through the supply lines, but valves may be used in some instances. Generally, the supply line for each process gas includes several safety shut-off valves (not shown) that can be used to automatically or manually shut off the flow of process gas into the chamber. When toxic or otherwise dangerous gases are used in the process, safety shut-off valves may be positioned at several locations along gas supply lines.

The deposition process performed in CVD system 10 can be either a thermal process or a plasma-enhanced process. In a plasma-enhanced process, an RF power supply 44 applies electrical power between the gas distribution faceplate 13a and heater pedestal 12 to excite the process gas mixture to form a plasma within the cylindrical region between the gas distribution faceplate 13a and heater pedestal 12. (This region will be referred to herein as the "reaction region"). In a deposition process, constituents of the plasma react to deposit a film on the surface of the semiconductor wafer supported on heater pedestal 12. RF power supply 44 can be a mixed frequency RF power supply that typically supplies power at a high RF frequency (RF1) of 13.56 MHz and at a low RF frequency (RF2) of 360 kHz to enhance the decomposition of reactive species introduced into the processing chamber 15. RF power supply 44 can supply either single- or mixed-frequency RF power (or other desired variations) to gas distribution manifold 11 to enhance the decomposition of reactive species introduced into processing chamber 15. In a thermal process, RF power supply 44 is not utilized, and the process gas mixture thermally reacts to deposit the desired film on the surface of the semiconductor wafer supported on heater pedestal 12, which is resistively heated to provide the thermal energy needed for the reaction.

During a plasma-enhanced deposition process, the plasma heats the entire the chamber, including the walls of the chamber body 15a surrounding the exhaust passageway 23 and the shut-off valve 24. During a thermal deposition process, heater pedestal 12 causes the processing chamber 15 to heat. When the plasma is not turned on, or during a thermal deposition process, a hot liquid may be circulated through the chamber body 15a in passageways (not shown) to maintain the chamber at an elevated temperature. Fluids used to heat or cool the chamber body 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool exhaust passages and migrate back into the processing chamber during periods of no gas flow.

The remainder of the gas mixture that is not deposited in a layer, including reaction by-products, is evacuated from the chamber by the exhaust system 31 (FIG. 1(a)). Specifically, the gases are exhausted through an annular, slot-shaped exhaust aperture 16 surrounding the reaction region and into an annular exhaust plenum 17. The slot-shaped exhaust aperture 16 and the annular exhaust plenum 17 are defined by the gap between the top of the chamber's cylindrical side wall 15a (including the upper dielectric lining 19 on the wall) and the bottom of the circular chamber lid 20. The 360° circular symmetry and uniformity of the slot-shaped exhaust aperture 16 and the annular exhaust plenum 17 are important to achieving a uniform flow of process gases over the wafer so as to deposit a uniform film on the wafer.

The gases flow underneath a lateral extension portion 21 of the annular exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump 28 through a foreline 27. The chamber exhaust rate may be controlled by the throttle valve 29, which may be closed to reduce the chamber exhaust rate, or opened to increase the chamber exhaust rate to the nominal exhaust capacity of the vacuum pump 28. The system controller 34 controls a servo motor 35 that actuates the throttle valve 29 and sets its position.

The wafer support platter of resistively-heated pedestal 12 is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of heater pedestal 12. Heater pedestal 12 may be made of material including aluminum, metal alloy, ceramic, or some combination thereof.

Typically, any or all of the chamber lining, gas inlet manifold, faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al.

The above reactor description is mainly for illustrative purposes, and other equipment such as electron cyclotron resonance (ECR) plasma CVD devices, induction-coupled RF high-density plasma CVD devices, or thermal CVD systems may be used with the present invention. Additionally, variations of the above-described system, such as variations in pedestal design, heater design, RF power frequencies, location of RF power connections and others are possible. For example, the wafer could be supported by a susceptor and heated by quartz lamps. The present invention is not limited to use with any specific apparatus.

II. A Remote Microwave Plasma Source and Processing Chamber

According to specific embodiments of the present invention, a CVD apparatus may be provided with a remote microwave plasma source by incorporating a remote plasma source into a CVD apparatus as-manufactured, or by retrofitting the existing CVD apparatus to incorporate a remote microwave plasma source. Such a remote plasma source is described in the commonly assigned U.S. Pat. No. 6,039,834, entitled "Apparatus And Methods For Upgraded Substrate Processing System With Microwave Plasma Source," by Tanaka et al., filed Mar. 5, 1997, which is herein incorporated by reference for all purposes. Cleaning a processing chamber with a remotely generated plasma has been shown to be quite efficient when compared to some in situ plasma cleaning processes, taking as little as half as long to produce comparable results.

Figure 2:
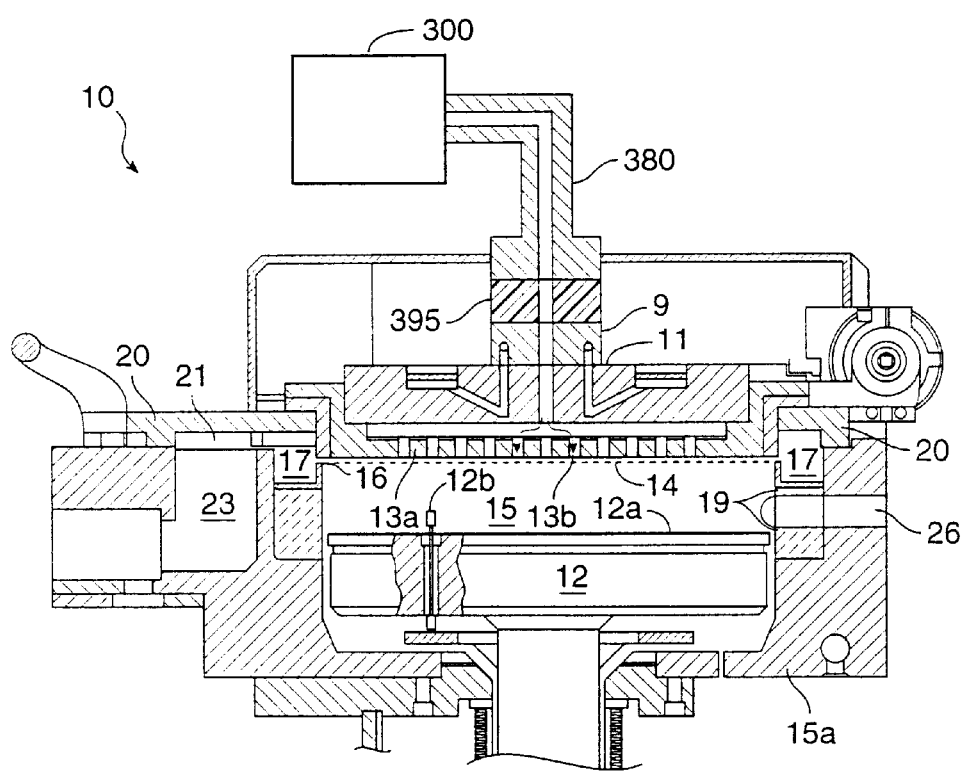
FIG. 2 is a side view of a remote microwave plasma source module in relation to an exemplary chamber for use therewith, according to an embodiment of the present invention.

In accordance with a specific embodiment of the present invention, FIG. 2 shows a remote microwave plasma source module 300 attached to the lid of a processing chamber 15 through the gas distribution manifold 11. An RF isolator 395 isolates the gas mixing block 9, which is energized with RF power during PECVD processes, from the plasma generator outlet manifold 380, which may then be grounded during PECVD processes. RF isolator 395 preferably is made of a material that provides RF isolation, such as alumina or polytetrafluoroethylene (PTFE), and which is resistant to etching by plasma species (such as fluorine radicals when forming the plasma using a fluorine-containing gas, like $NF_3$). Such materials, including PTFE (commercially available, for example, as Teflon™ PTFE), reduce fluorine radical recombination inside the conduit provided by outlet manifold 380 during cleaning processes. Of course, other materials may be used, depending on the particular reactive chemistry of a particular process.

Positioning the remote plasma source module 300 so that the plasma flows into the chamber through the gas distribution manifold 11 produces a beneficial flow of plasma species. Specifically, flowing the plasma through the holes 13b in the faceplate 13a into the chamber 15 provides a relatively high concentration of plasma species in the region of the faceplate 13a, where residue may be heavy. This helps to remove deposits from the faceplate 13a and the holes 13b, thus keeping the holes clear for subsequent deposition processes.

III. Exemplary Cleaning Processes

Embodiments of the present invention are useful in cleaning CVD apparatus or other apparatus. The type of plasma precursor gas used depends on the type of residue to be cleaned. Fluorine radicals are useful in cleaning residues of silicon oxides and/or silicon nitrides. Nitrogen trifluoride ($NF_3$) is a desirable cleaning gas because it readily produces fluorine radicals in a microwave-generated plasma, resulting in an efficient cleaning process. However, other cleaning gases, such as $CF_4$, $ClF_3$, and $F_2$ may be used. Perfluorocarbons (PFCs), such as $CF_4$, work well in some in situ plasma cleaning processes, but are less desirable than $NF_3$ in the following processes because PFCs are relatively expensive. Chlorine-containing gases, such as $ClF_3$, may leave chlorine-containing residues that may interfere with some wafer processing operations subsequent to the cleaning process, and $F_2$ may be difficult to dissociate into and maintain as free fluorine radicals in a microwave plasma, which may result in a lower yield of radicals and a slower cleaning process.

When performing a cleaning process, it is desirable to determine the process endpoint for many reasons. First, it is desirable to minimize cleaning time to maximize wafer throughput. Second, it is undesirable to overetch chamber components. Third, it is desirable to minimize the waste stream generated by the cleaning products, which often contains toxic or corrosive compounds. Fourth, it is desirable to minimize the cost of the reactant gases needed to effectuate a chamber clean because the reactant gas may be expensive.

Figure 3A:
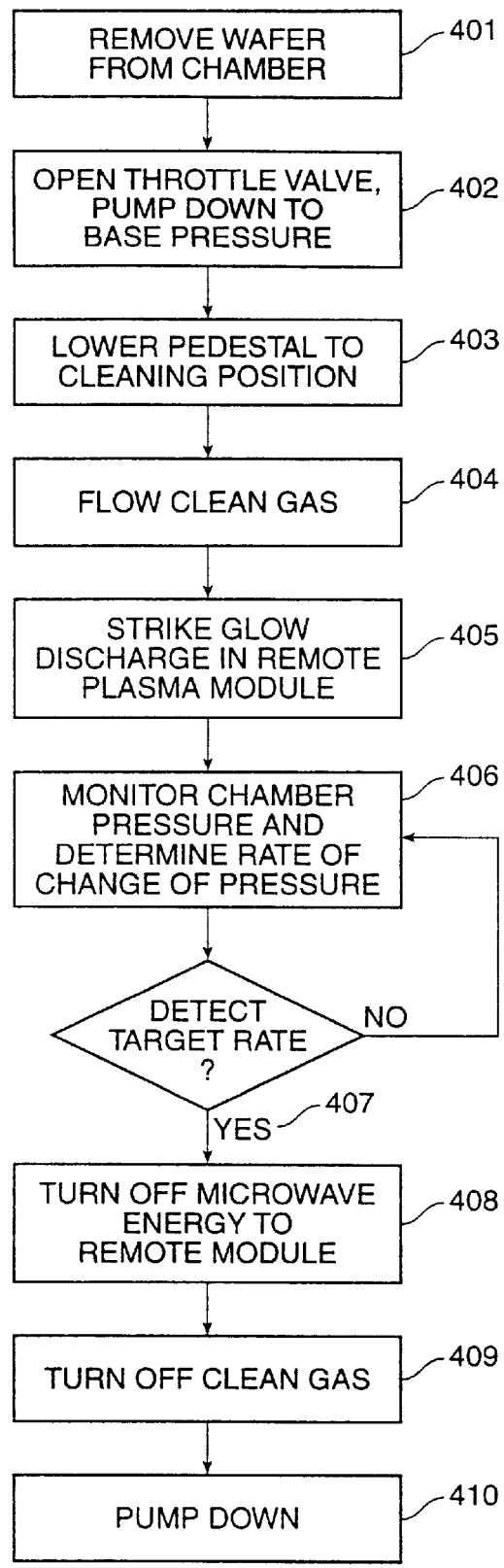
FIG. 3(a) is a flow chart of an embodiment of a remote plasma cleaning process at a constant exhaust rate with a pressure-based endpoint detection.
Figure 4:
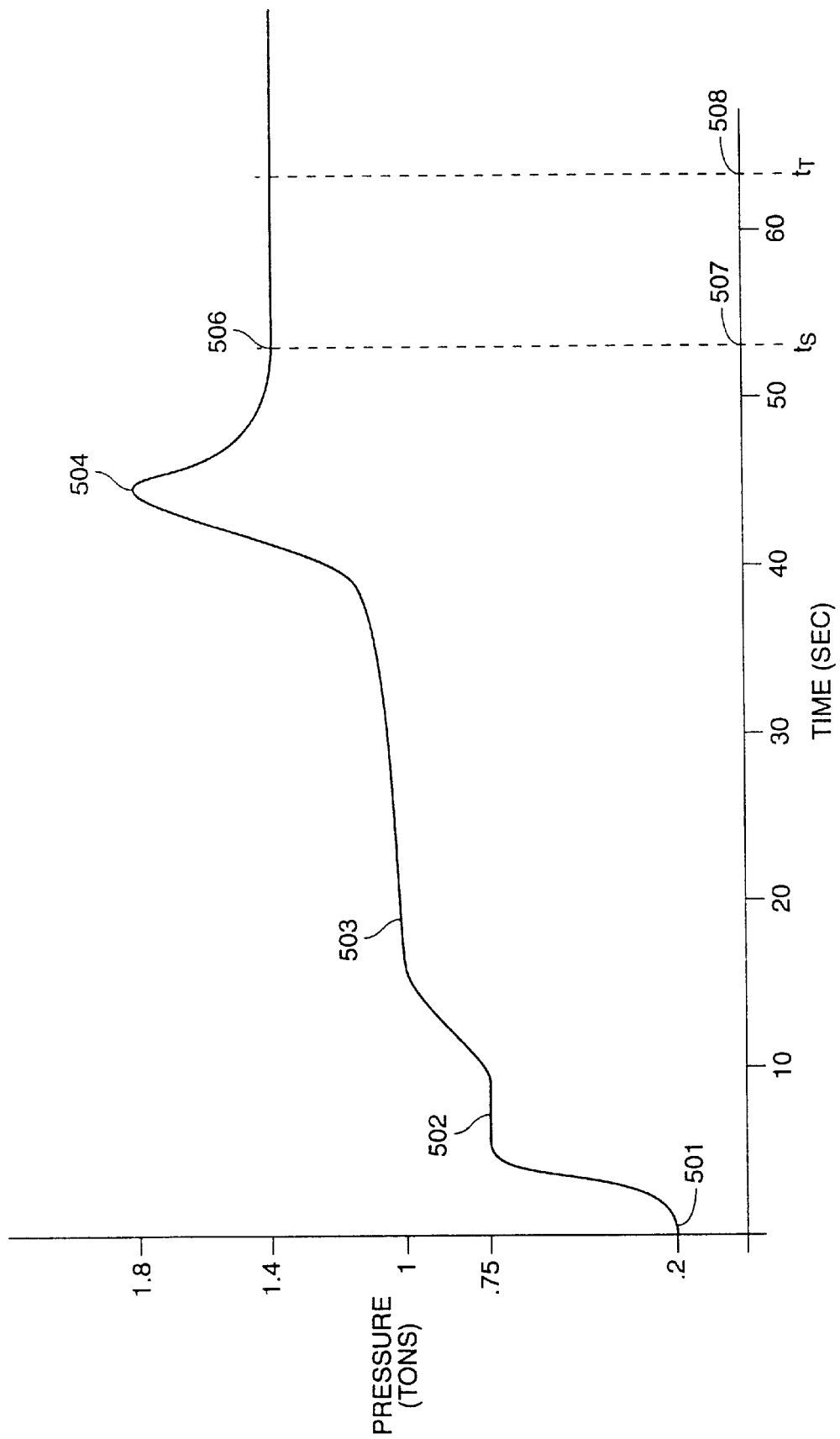
FIG. 4 is a graph showing the change in chamber pressure versus time during a remote plasma cleaning process utilizing a constant exhaust rate.

FIG. 3(a) is a flow chart of an embodiment of a remote plasma cleaning process with endpoint detection in which the throttle valve is held at a fixed position throughout the cleaning process, and FIG. 4 is a graph of pressure versus time for a cleaning process according to the flow chart of FIG. 3(a). The following discussion of an exemplary cleaning process is made in reference to FIGS. 3(a) and 4. The cleaning process may be performed after each deposition step (per wafer), or may be performed after a number of deposition steps. FIG. 4 relates to cleaning an approximately 10,000 Å layer of silicon nitride residue deposited during a single wafer deposition step. While the x-axis of FIG. 4 is shown as time, it is understood that the time required to complete a cleaning process depends on the thickness of the deposits to be cleaned, among other factors. However, FIG. 4 provides a good illustration of the sequence of events of a specific cleaning process.

The cleaning process is started after the last processed wafer is removed (step 401) and the chamber is pumped down to a base pressure of between about 50 mtorr and 1.5 torr, in this example 0.2 torr (step 402) (FIG. 4, 501), by 10 completely opening the throttle valve. The wafer pedestal is lowered to its cleaning position (step 403), which in this example is 600 mils below the gas distribution faceplate. The temperature of the heater pedestal does not have to be altered from the wafer processing temperature for this cleaning process. For example, if a silicon nitride film had been deposited at a temperature of 400° C., the cleaning process could proceed at a temperature of 400° C. This saves time compared to other processes where the heater pedestal may have to be heated or cooled in order to perform the clean, and also reduces wear of the heater associated with thermal cycling.

A flow of about 700 sccm of $NF_3$ (step 404) through the remote plasma module into the chamber begins at a gas flow start time and establishes an initial cleaning process pressure of about 0.75 torr (FIG. 4, 502), while the throttle valve is held in a fixed position, creating a constant rate of exhaust. If the chamber were clean, this initial cleaning pressure would be higher, possibly as high as 1.4 torr, but it is believed some of the $NF_3$ is initially adsorbed onto the surface of the chamber, particularly the deposits. Maintaining a constant gas flow rate and exhaust rate stabilizes the chamber pressure in about 5 seconds. Pressures in the range of about 0.5 torr to 1.5 torr have been found to work well for this process, but it is desirable to keep the cleaning pressure below a threshold pressure because the cleaning rate may decrease with pressure. While increasing the chamber pressure might be expected to increase the rate of cleaning, it is believed that increasing the pressure also increases the number of plasma species, such as fluorine radicals, available for recombination into less-reactive species, such as $F_2$. Thus, the rate of cleaning may unexpectedly decrease with an increase in chamber pressure.

After the cleaning gas flow has stabilized, the remote microwave plasma generator is energized, which creates a glow discharge plasma within the remote microwave plasma generator (step 405). The microwave energy activates the $NF_3$ into ions and radicals, including free fluorine radicals. This increase in the number of particles within the chamber increases the chamber pressure to about 1 torr (FIG. 4, 503). Some of the ions and radicals recombine, but a portion of the free fluorine radicals produced in the glow discharge within the remote plasma generator survive long enough to react with the silicon nitride deposits.

The fluorine radicals react with the silicon nitride deposits to form ammoniumfluosilicate ($(NH_4)_2SiF_6$), which at least partially dissociates at the temperature and pressure of the chamber, and is carried off by the exhaust stream. During this portion of the cleaning process, the chamber pressure is monitored and the rate of change of pressure is calculated by the system controller according to the process program stored in the memory (step 406). A peak pressure, corresponding to the maximum rate of evolution of the reacted, dissociated deposits, occurs typically between 1.5 and 2.5 torr. The peak pressure may vary outside of these limits depending upon the cleaning conditions, such as using a different cleaning gas, cleaning deposits with different compositions, or performing the cleaning process at a different pressure. In this example, the peak pressure occurs at about 1.8 torr (FIG. 4, 504). As the deposits are consumed, the chamber pressure drops and stabilizes at a pressure of 1.4 torr (FIG. 4, 506). This stable pressure indicates a zero rate of change of pressure, which is the endpoint rate of change of pressure for this process (step 407) and the microwave energy may be turned off (step 408). In this instance, a stable pressure is defined as when the pressure remains within ±0.05 torr over a period of five seconds, with pressure readings being taken every 0.1 seconds. Those skilled in the art understand that other limits may define a stable pressure, and that the endpoint of the cleaning process may be defined according to other rates of pressure changes.

In this instance, the stable pressure indicates essentially a zero rate of change of chamber pressure and this specific rate of change is appropriate for this embodiment. In other embodiments, other rates of change may be appropriate, as when different residues are being cleaned, or different cleaning gases are used, which may affect the rate of evolution of volatile products. The appropriate rate may also depend on the pressure sensor used and the nominal chamber pressure. It may even be appropriate in some instances to detect the peak pressure, also a zero rate of change, to determine the endpoint of a cleaning process. Methods of monitoring the chamber pressure versus time and calculating the rate of change of pressure are well known to those skilled in the art.

The main cleaning process cleans those portions of the chamber with substantial build-up of silicon nitride deposits, such as the gas distribution faceplate, chamber lid, and chamber body in the vicinity of the gas distribution faceplate. The $NF_3$ is then turned off (step 409) and the chamber is pumped down (step 410) to the base pressure, which may be different for each chamber but in this instance is about 0.2 torr, in preparation for the next wafer processing step.

In some instances, stray deposits, such as deposits on the view windows, may not be completely removed during the main chamber cleaning process. It may be desirable to continue the remote microwave plasma cleaning process for a portion of time beyond the point where the specified rate of change of pressure is detected (FIG. 4, 506) to clean these stray deposits. This portion of the cleaning process is referred to as "overetching".

The overetch period is based on the time it takes to reach a the desired rate of change of pressure, $t_s$, which represents completion of the main cleaning process (FIG. 4, 507). This overetch period is typically between 5% and 30% of $t_s$, but other percentages of $t_s$ may be appropriate in other embodiments. In this example, the overetch period is chosen to be 20% of $t_s$ and would occur between steps 407 and 408 of FIG. 4. For example, if $t_s$ is 53 seconds, then the overetch period would be 10.6 seconds, and the total cleaning time, $t_T$ (FIG. 4, 508) would be 63.6 seconds. Different overetch periods may be appropriate for different chambers or different residues, as the stray deposition pattern may vary depending on a number of factors, such as process gas flow, exhaust patterns, and chamber wall temperature. Even with the overetch period, the process of FIG. 3A takes only about half the time of some in situ plasma cleaning processes.

Figure 3B:
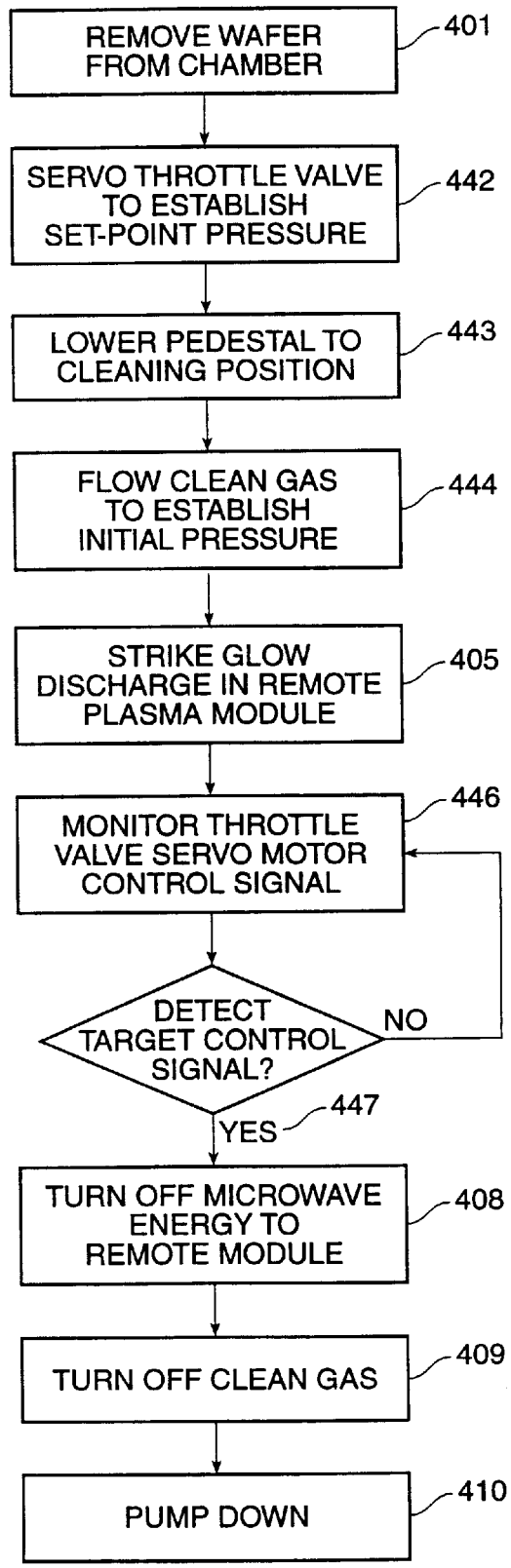
FIG. 3(b) is a flow chart of an embodiment of a pressure-controlled remote plasma cleaning process with a servo control-based endpoint detection.

FIG. 3B is a flow chart of an another embodiment of the present invention wherein the throttle valve is controlled by a servo motor to maintain a target chamber pressure during the cleaning process. In some situations- for example, between several chambers in a manufacturing area- it may be desirable to standardize the cleaning process pressure for all chambers within the area to standardize the cleaning time. Different chambers will have different exhaust capacities depending on the vacuum pump used, foreline length and diameter, and chamber configuration, among other factors. Operating the clean process at a controlled pressure may decrease the exhaust rate for the chambers, because the chambers will be operating with the throttle valve partially closed, but it offers the advantage of more uniform and predictable cleaning times, thus improving product flow.

The set-point pressure for a group of chambers may be set above the stabilized pressure (e.g., FIG. 4, 506) attainable by the system with the worst-case exhaust capacity. All other systems will be able to meet the exhaust capacity of the worst-case system by partially closing the throttle valve. The throttle valves are controlled with servo motors according to the chamber pressure as measured with a pressure sensor, such as a manometer. The pressure sensor produces an electronic signal that the system controller can read.

The set-point pressure is set slightly above the worst-case stabilized pressure so that the throttle valve of the worst-case system is also servo-controlled during the endpoint of the chamber cleaning. During the initial portion of the cleaning process (which would correspond to regions 502 and 503, FIG. 4, of a constant-exhaust-rate process, such as shown in FIG. 3(*a*), partially closing the throttle valve on a system may regulate the chamber pressure at the set-point pressure (e.g., above the pressure of regions 502 and 503, FIG. 4). As the evolution of reactant products increases, the released gas may exceed the exhaust capacity of the system, causing the pressure to rise even though the throttle valve is fully opened by the servo motors. This condition is known as "open loop". However, as the evolution of reactant products decreases, the exhaust capacity of the system will again be able to maintain the chamber pressure at the set-point pressure. Those skilled in the art will appreciate that an open loop condition depends on many design parameters, such as loop bandwidth, sensor response, throttle valve response, and other factors.

The servo motor is a stepper motor and will open or close the throttle valve in stepwise fashion according to a control step signal. A stepper motor has a certain number of steps per revolution of the motor shaft. Each position of the motor shaft corresponds to a number of steps from an initial position. The throttle valve is considered fully closed with the stepper motor at 120 steps and fully open with the stepper motor at 800 steps. The control step signal is generated by the system controller in conjunction with the process program stored in memory according to the difference between the measured chamber pressure and the target (set-point) chamber pressure. The higher the chamber pressure is from the set-point pressure, the wider the throttle valve will be opened, within predetermined limits, so that the desired pressure can be reached in the shortest time. The change in the chamber exhaust rate is not necessarily constant with each step change.

Once the chamber pressure has stabilized after the main chamber cleaning, the servo motor will not need to be stepped to maintain the set-point pressure, although system noise may result in some level of control signal being sent to the stepper motor, even under stable conditions. This stable pressure point corresponds to the stabilization pressure 506 of FIG. 4; however, in the process of FIG. 3(*b*) this point may be determined by monitoring the servo motor steps rather than the chamber pressure, as in the process of FIG. 3(*a*). If the control signal to the servo motor, which is sent about every 0.1 seconds, is less than five steps the pressure is considered to be stable. However, those skilled in the art understand that the control limits may be set according to specific system conditions, as discussed above, and that different chambers and different cleaning gases may have different control parameters to define a stable condition.

The pressure-controlled clean process also starts with removal of the last processed wafer (step 401) and pumping down the chamber to a base pressure of between about 50 mtorr to 1.5 torr (step 442). As discussed above, this base pressure will be chosen according to a worst-case base pressure in a group of chambers. Selection of the base pressure in this manner ensures that each throttle valve of each chamber will be partially closed (less than maximum exhaust) and controlled by a servo motor in response to the chamber pressure, as measured with a manometer. The wafer pedestal is lowered to its cleaning position (step 443), which, in this example, is 600 mils below the gas distribution faceplate but is not necessarily the same position as would be optimal in the open-loop process associated with FIG. 3(*a*). As discussed above, the temperature of the heater pedestal does not have to be altered from the wafer processing temperature for this cleaning process.

A flow of between about 400 to 800 sccm of $NF_3$ (step 444) through the remote plasma module into the chamber results in an initial chamber cleaning pressure of about 1.5 torr. In this instance, the initial cleaning pressure depends on the set-point pressure, because the system is operating with a throttled-back exhaust system. The flow rate of $NF_3$ is chosen to maximize the rate of cleaning for the group of chambers within the constraints of the worst-case exhaust capacity. As discussed above, increasing the pressure above a threshold pressure may actually decrease the rate of cleaning and increase the cleaning process time.

After the initial chamber cleaning pressure is established, the remote microwave plasma generator is energized, creating a glow discharge within the remote microwave plasma generator (step 405). The microwave energy activates the $NF_3$ gas into ions and radicals, including free fluorine radicals. Some of the ions and radicals recombine, but a portion of the free fluorine radicals produced in the glow discharge within the remote plasma generator survive long enough to react with the silicon nitride deposits within the processing chamber. The fluorine radicals react with the silicon nitride deposits to form ammoniumfluosilicate $((NH_4)_2SiF_6)$, which dissociates at the temperature and pressure of the chamber and is carried off by the exhaust stream. During this portion of the cleaning process, the chamber pressure is controlled to maintain the set-point pressure by adjusting the position of the throttle valve with the servo motor, which in a specific embodiment is a stepper motor.

The pressure control system may go open loop at the peak rate of evolution of ammoniumfluosilicate. This will produce a constant, fully open control signal for the duration of the open-loop period; however, this open-loop signal is a predictable value not produced in closed-loop operation. Therefore a constant open-loop signal is distinguishable from an essentially constant closed-loop signal, in which the throttle valve is maintained in a partially opened position for a period of time.

The step signals to the servo motor, which indicate whether the throttle valve position is being changed in response to a change in chamber pressure, are monitored by the system controller (step 446) to provide an indication of the rate of change of the chamber pressure. As the evolution of ammoniumfluosilicate diminishes, the servo motor will continue closing the throttle valve. Eventually, the chamber pressure stabilizes, representing a zero rate of change of pressure, and the control signal will fall within a target window (step 447), which will cause the system controller to create a cleaning process endpoint signal. At this point, the main cleaning process is complete and the microwave energy may be turned off (step 408). The main cleaning process cleans those portions of the chamber with substantial build-up of silicon nitride deposits, such as the gas distribution faceplate, chamber lid, and chamber body in the vicinity of the gas distribution faceplate. The $NF_3$ is then turned off (step 409) and the chamber is pumped down (step 410) to base pressure (e.g., 0.2 torr), either by setting a new chamber pressure set-point or by completely opening the throttle valve, in preparation for the next wafer processing step. As for the process described in conjunction with FIG. 3(*a*), an overetch step could be added to the process described in conjunction with FIG. 3(*b*).

While the above is a complete description of specific embodiments of the present invention, various modifications, variations, and alternatives may be employed. The above-described gas flows, chamber pressures and temperature ranges provide for cleaning procedures that are sufficient to remove undesired oxide or nitride residues that may be built up after processing wafers or substrates. The parameters in the above processes should not be considered limiting to the claims. The actual values (temperature, pressure, gas flows, etc.) selected for a particular cleaning recipe will vary according to various applications. Flow values mentioned above are for a D×Z chamber (equipped for a 200-mm wafer and with a total volume of about 5 liters) manufactured by Applied Materials of Santa Clara, Calif., but flow values may differ depending on the type or size of chamber used. For example, a multimode chamber would require different flow values. In addition, flow values described above are for a remote microwave plasma generator with dimensions according to the specific embodiments and may differ for remote plasma generators with other dimensions. One of ordinary skill in the art will understand that other chemicals, chamber parameters, and apparatus may be used with the present invention.

It is to be understood that the above description is intended to be illustrative and not restrictive. Many embodiments will be apparent to those of skill in the art upon reviewing the above description. Those skilled in the art will recognize other equivalent or alternative methods of cleaning dielectric residue or other deposits, such as metal residue, from substrate processing systems while remaining within the scope of the claims of the present invention, such as generating a plasma with an electron-cyclotron resonator source instead of a magnetron, or generating a plasma in situ. Although the above description discusses $NF_3$ in particular, other reactive gases including, but not limited to, $F_2$, $CF_4$, $C_2F_6$, $C_3F_8$, $SF_6$, or $ClF_3$ may be used for cleaning substrate processing systems used to deposit silicon oxides or nitrides, and other gases may be used for cleaning other types of residue. Therefore, the scope of the inventions should be determined with reference to the following claims, along with the fall scope of equivalents to which such claims are entitled, rather than with reference to the above description.

What is claimed is:

1. A method of cleaning silicon nitride deposits from a substrate processing chamber, the method comprising:
    (a) exposing a chamber to a plasma formed from a cleaning gas to clean the silicon nitride deposits from the substrate processing chamber;
    (b) measuring a pressure level wit said chamber to determine a specified rate of change of pressure; and
    (c) extinguishing said plasma in response to said specified rate of change of pressure.

2. The method of claim 1 wherein said cleaning gas includes at least one halogen element.

3. The method of claim 2 wherein said cleaning gas comprises $NF_3$.

4. The method of claim 1 therein said specified rate of change of pressure is essentially a zero rate of change.

5. The method of claim 1 wherein said extinguishing of said plasma is accomplished by turning off a plasma power supply.

6. A method of cleaning deposits from a substrate processing chamber, the method comprising:
    (a) exposing a chamber to a plasma formed from a cleaning gas;
    (b) measuring a pressure level within said chamber to determine a specified rate of change of pressure;
    (c) waiting a period of time; and
    (d) extinguishing said plasma in response to said specified rate of change of pressure.

7. The method of claim 6 wherein said plasma flows from said remote microwave plasma generator into said chamber through a gas distribution faceplate.

8. The method of claim 6 wherein said period of time is between about 5%–30% of the time between said step (a) and said determination of said specified rate of change of pressure.

9. The method of claim 1 wherein said detecting of said specified rate of change of pressure occurs after a peak chamber pressure.

10. The method of claim 1 wherein said chamber is exposed to said plasma at an initial pressure of between about 50 mtorr and about 1.5 torr.

11. A method for cleaning oxide residue or nitride residue from a substrate processing chamber, the method comprising:

a) exposing a chamber to a plasma formed in a remote plasma generator from a cleaning gas;

b) establishing a controlled pressure in said chamber;

c) monitoring a step signal to a stepper motor, said stepper motor being coupled to a valve and being capable of adjusting said valve in response to said step signal, to detect a specified rate of change of said step signal; and d) extinguishing said plasma in response to detecting said specified rate of change of said step signal.

12. The method of claim 11 wherein said controlled pressure of step (b) is between about 0.05 and 1.5 torr.

13. The method of claim 11 wherein said cleaning gas comprises a halogen.

14. The method of claim 11 wherein said cleaning gas comprises fluorine.

15. The method of claim 11 wherein said cleaning gas comprises $NF_3$.

16. The method of claim 1 wherein said specified rate of change of pressure occurs essentially at a maximum pressure.

17. A substrate processing system comprising:

a processing chamber;

a plasma system configured to provide a plasma in said processing chamber;

a gas delivery system configured to deliver a cleaning gas to said plasma system;

a vacuum system configured to evacuate said processing chamber, said vacuum system including a chamber pressure sensing device producing a pressure signal;

a controller configured to control said gas delivery system, said vacuum system, and said plasma system; and a memory, coupled to said controller, having a computer-readable program embedded therein for directing operation of said substrate processing system, said computer-readable program including:

i) a first set of computer instructions for controlling said gas delivery system to flow said cleaning gas to said plasma system;

ii) a second set of computer instructions to read said pressure signal to determine a rate of change of chamber pressure, said specified rate of change of chamber pressure being stored in said memory;

iii) a third set of computer instructions for controlling said plasma system to energize said plasma system to produce a plasma from said cleaning gas, and to extinguish said plasma in response to said specified rate of change of pressure.

18. The method of claim 11 wherein the remote plasma generator is a remote microwave plasma generator.

19. A method of cleaning silicon nitride deposits from a substrate processing chamber, the method comprising:

(a) flowing $NF_3$ into a remote plasma generator;

(b) forming a plasma from the $NF_3$ in the remote plasma generator, the plasma containing plasma species;

(c) flowing the plasma species from the remote plasma generator into the substrate processing chamber through a gas distribution faceplate;

(d) measuring a pressure level within said chamber to determine a specified rate of change of pressure; and (e) extinguishing the plasma in response to the specified rate of change of pressure.

20. A method of cleaning silicon nitride deposits from a substrate processing chamber, the method comprising:

a) flowing $NF_3$ into a remote plasma generator;

b) forming a plasma from the $NF_3$ in the remote plasma generator, the plasma containing plasma species;

c) flowing the plasma species from the remote plasma generator into the substrate processing chamber through a gas distribution faceplate;

d) measuring a pressure level within said chamber to determine a rate of change of pressure; and e) in response to detecting a specified rate of change of pressure, waiting a selected period of time and then extinguishing the plasma.

21. A method of cleaning silicon nitride deposits from a substrate processing chamber, the method comprising:

(a) flowing $NF_3$ into a remote plasma generator;

(b) forming a plasma from the $NF_3$ in the remote plasma generator, the plasma containing plasma species;

(c) flowing the plasma species from the remote plasma generator into the substrate processing chamber through a gas distribution faceplate;

(d) establishing a controlled pressure in the substrate processing chamber;

(e) monitoring a pressure control signal to detect a specified rate of change of the pressure control signal; and (f) extinguishing the plasma in response to detecting the specified rate of change of the pressure control signal.

22. A method of setting a chamber operating pressure, the method comprising:

(a) determining a minimum pressure attainable by each of a plurality of vacuum chamber substrate processing systems; and (b) setting a controlled pressure set-point for each of at least two of the plurality of vacuum chamber substrate processing systems, wherein the controlled pressure set-point is above the minimum pressure.

23. A method of detecting an endpoint of a process occurring in a substrate processing chamber having a vacuum system and a throttle valve fluidly coupled between the vacuum system and the chamber, the method comprising:

(a) performing a process in the substrate processing chamber;

(b) monitoring a control signal that corresponds to a position of the throttle valve; wherein said control signal is generated according to a difference between a measured value of a pressure in said process chamber and a target value for said pressure; and (c) determining an endpoint of said process in response to a behavior of said control signal; and subsequently (d) terminating said process.

24. The method of claim 23 wherein said behavior of said control signal corresponds to a constant closed loop signal.

25. The method of claim 23, wherein said (c) includes distinguishing said behavior of said control signal from an open loop control signal.

26. The method of claim 23, further comprising:

between said (c) and said (d), in response to detecting a specified change of said control signal, waiting a selected period of time before terminating said process.

27. The method of claim 23, wherein said process is a cleaning process.

28. The method of claim 27, wherein said cleaning process uses a remote plasma.

29. The method of claim 28, wherein said cleaning process removes silicon nitride deposits from exposed surfaces within the processing chamber.

* * * * *